United States Patent
Yamana

[11] Patent Number: 6,096,478
[45] Date of Patent: Aug. 1, 2000

[54] RESIST MATERIAL FOR FORMING A CHEMICALLY AMPLIFIED NEGATIVE TYPE RESIST PATTERN AND METHOD OF MANUFACTURING A SEMICONDUCTOR DEVICE EMPLOYING THE RESIST PATTERN

[75] Inventor: Mitsuharu Yamana, Tokyo, Japan

[73] Assignee: NEC Corporation, Tokyo, Japan

[21] Appl. No.: 09/256,615

[22] Filed: Feb. 23, 1999

[30] Foreign Application Priority Data

Feb. 23, 1998 [JP] Japan .................................. 10-040301

[51] Int. Cl.⁷ ...................................................... G03F 7/004
[52] U.S. Cl. ......................... 430/270.1; 430/914; 430/921
[58] Field of Search ................................ 430/270.1, 921, 430/914

[56] References Cited

U.S. PATENT DOCUMENTS 5,824,824 10/1998 Owasa et al. .............................. 568/49

FOREIGN PATENT DOCUMENTS 4-314055 11/1992 Japan .
5-216234 8/1993 Japan .
6-67413 3/1994 Japan .

OTHER PUBLICATIONS

JP 10223503A, Aug.–1998, Derwent Abstract.
Hashimoto et al. Microelectronic Eng. 41/42, 1998, 363–366.

*Primary Examiner*—Janet Baxter
*Assistant Examiner*—Rosemary Ashton

[57] ABSTRACT

An object of the present invention is to inhibit a size difference possibly caused due to different pattern densities, and at the same time to form a desired resist having fewer irregularities on the side walls thereof, all with respect to a chemically amplified negative type resist. In order to achieve the object, a resist material of the present invention comprises a resin for forming the resist material, a first photo-acid generating agent having a molecular weight of 100–1000 and capable of producing an acid having a diffusion length of 10–30 nm, a second photo-acid generating agent having a molecular weight of 100–1000 and capable of producing an acid having a diffusion length of 30–60 nm. In particular, a mixing ratio for mixing the second photo-acid generating agent into the first photo-acid generating agent is 5–95 mol %, a mixing ratio for mixing a total amount of the first and second photo-acid generating agents into the resin is 1–15 wt %.

8 Claims, 2 Drawing Sheets

DENSE PATTERN SPARSE PATTERN
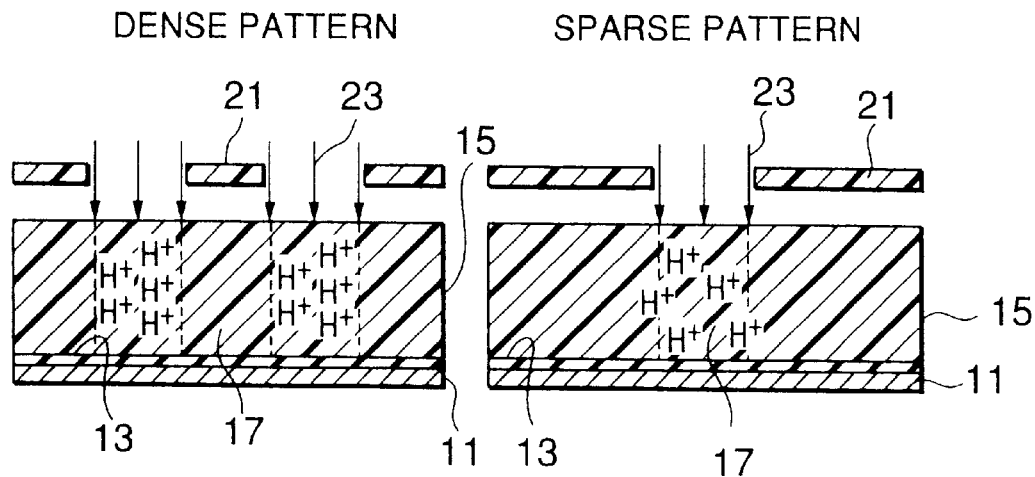
FIG.1A
PRIOR ART
FIG.2A
PRIOR ART
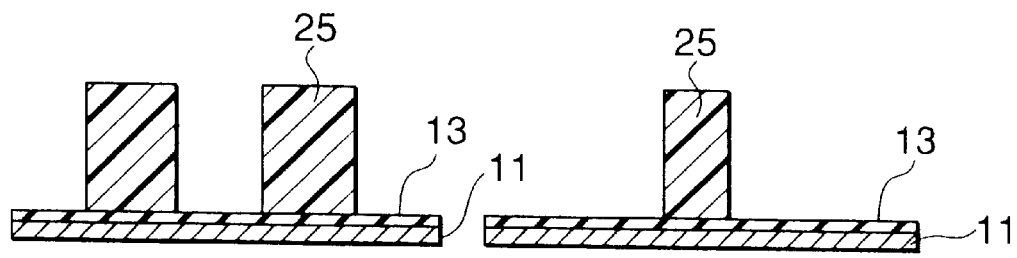
FIG.1B
PRIOR ART
FIG.2B
PRIOR ART
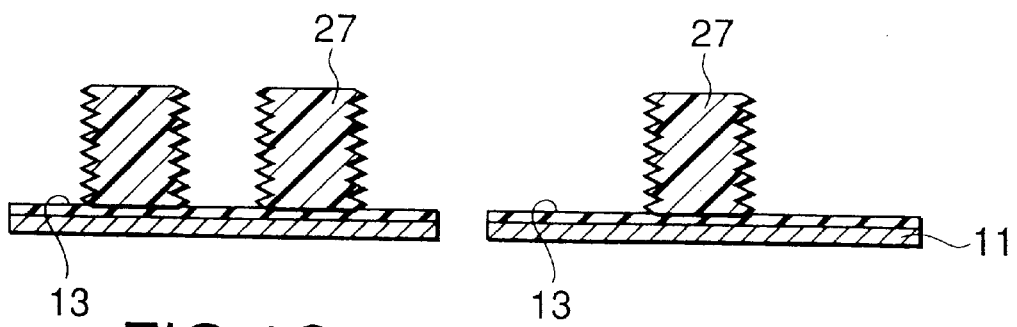
FIG.1C
PRIOR ART
FIG.2C
PRIOR ART

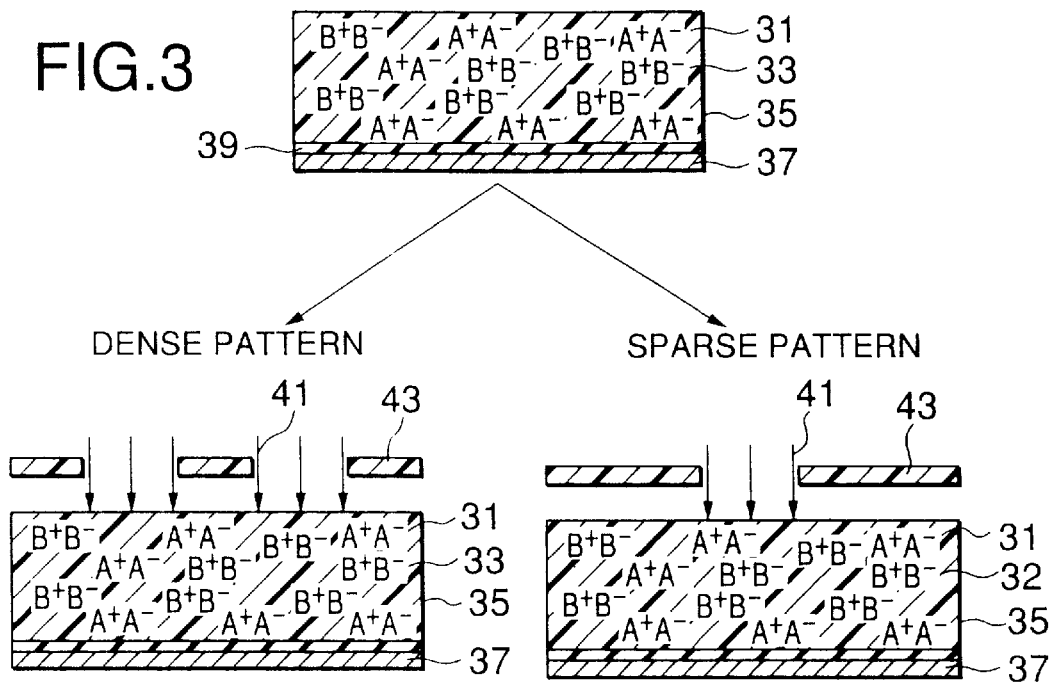
FIG. 3
DENSE PATTERN
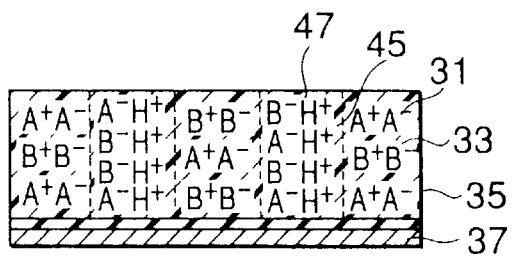
FIG. 4A
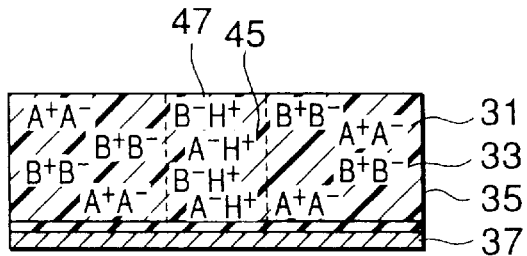
FIG. 5A
SPARSE PATTERN
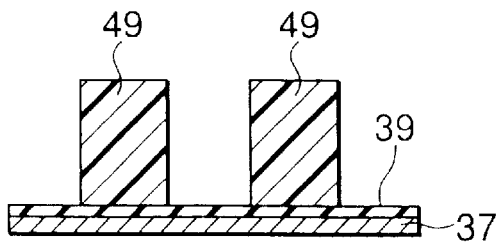
FIG. 4B
FIG. 4C
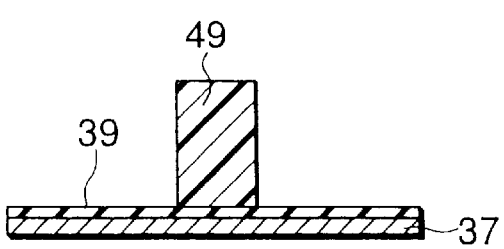
FIG. 5B
FIG. 5C

RESIST MATERIAL FOR FORMING A CHEMICALLY AMPLIFIED NEGATIVE TYPE RESIST PATTERN AND METHOD OF MANUFACTURING A SEMICONDUCTOR DEVICE EMPLOYING THE RESIST PATTERN

BACKGROUND OF THE INVENTION

1. Field of the Invention

The present invention relates to a photoresist material which is to be formed into a photoresist film on a semiconductor substrate. The photoresist film is used in order that a light exposure may be effected through a reticle mask or other sort of a mask indicating a pattern of a desired semiconductor integrated circuit, and a PEB (Post Exposure Bake) treatment is then performed followed by a developing treatment with the use of a developing solution, thereby forming a rectangular resist pattern. Further, this invention relates to an etching method involving the use of the resist pattern consisting of the photoresist material. Moreover, the present invention also relates to a method for manufacturing a semiconductor device.

2. Description of the Related Art

A light exposure technique according to a prior art employs an exposure device using light exposure beams including g light ray (436 nm) and i light ray (365 nm), further employs a novolack resist material. However, according to a higher integration in LSI (Large Scale Integration) device, a lithography technique is required which uses excimer laser (248 nm, 193 nm). The excimer laser are far ultraviolet lights favorable for micro-treatment. Nevertheless, it has been found that a novolack resist material has a large light absorption and a greatly increased photo-sensitivity but has a difficulty in obtaining a proper resist shape when the novolack resist material is used.

In order to solve the problem, a chemically amplified resist material has been suggested. The chemically amplified resist material will vary in its dessolving selectivity in a resin by virtue of a sensitization reaction of an acid catalyst of an acid generated from a photo-acid generating agent so that a higher photo-sensitivity can be permitted.

Japanese Unexamined Patent Publication Nos. 4-314055 and 6-67413 (hereinafter referred to as prior arts 1 and 2, respectively), have disclosed some examples in which p-hydroxy styrene resin is used as a resin, while a photo-acid generating agent containing a trifluoromethane sulfonic acid ester is used as a photo-acid generating agent. However, in both of the prior arts 1 and 2, since the trifluoromethane sulfonic acid has a relatively long diffusion length, a problem may occurs in using such photo-acid generating agent in a logical device. The problem is that a sparse pattern, rather than a dense pattern, will become narrow in pattern size.

Further, Japanese Unexamined Patent Publication No.5-216234 (hereinafter referred to as prior art 3) has disclosed an example in which p-hydroxy styrene resin is used as a resin, while a naphthoquinone diazido sulfonic acid ester and a further photo-acid generating agent are used as photo-acid generating agents. However, in the prior art 3, the naphthoquinone diazido sulfonic acid ester tends to absorb too much excimer laser (248 nm, 193 nm), resulting in a problem that a resist pattern will become an inverted taper pattern, hence, to cause a deterioration in the resist pattern. Moreover, due to a photo-acid generating agent which produces an acid having a relatively short diffusion length, the irregularities on pattern side walls will become undesirably remarkable.

Therefore, when manufacturing a semiconductor device, particularly in making a logical device, it is important to eliminate resist pattern size differences possibly caused due to different pattern densities.

SUMMARY OF THE INVENTION

It is an object of the present invention to provide an improved resist material for a chemically amplified negative type resist pattern, thereby obtaining a resist pattern capable of inhibiting a pattern size difference possibly caused due to different pattern densities, and at the same time ensuring the formation of a resist pattern shape having fewer irregularities on the side walls thereof.

It is another object of the present invention to provide an improved resist material for a chemically amplified negative type resist pattern, capable of forming a rectangular shape, improving a resolution property and focus depth and size precision, thus enabling a further higher integration for a logical device.

It is still another object of the present invention is to provide an etching method which employs a resist pattern consisting of the resist material.

It is yet another object of the present invention is to provide a method for manufacturing a semiconductor device which employs a resist pattern consisting of the resist material.

According to one aspect of the present invention, there is provided a resist material which comprises a resin for forming the resist material, a first photo-acid generating agent having a molecular weight between 100 and 1000 and producing an acid having a diffusion length between 10 and 30 nm by exposure, and a second photo-acid generating agent having a molecular weight between 100 and 1000 and capable of producing an acid having a diffusion length between 30 and 60 nm by exposure. In particular, the second photo-acid generating agent is mixed into the first photo-acid generating agent at a ratio between 5 and 95 mol %. The first and the second photo-acid agents is mixed into a resin at a ratio that a total amount of the first and the second photo-acid generating agent is between 1 and 15 wt %. The first and the second photo-acid generating agents are specified by a single combination selected from a group consisting of a first combination of onium salts, a second combination of non-onium salts, and a third combination of a non-onium salt and an onium salt, respectively.

According to another aspect of the present invention, there is provided a chemically amplified negative type resist pattern which comprises a resin for forming the resist pattern, a first photo-acid generating agent having a molecular weight between 100 and 1000 and producing an acid having a diffusion length between 10 and 30 nm by exposure, a second photo-acid generating agent having a molecular weight between 100 and 1000 and producing an acid having a diffusion length between 30 and 60 nm by exposure. In particular, the second photo-acid generating agent is mixed into the first photo-acid generating agent at a ratio between 5 and 95 mol %. The first and the second photo-acid agents is mixed into a resin at a ratio that a total amount of the first and the second photo-acid generating agent is between 1 and 15 wt %. The first and the second photo-acid generating agents are specified by a single combination selected from a group consisting of a first combination of onium salts, a second combination of non-onium salts, and a third combination of a non-onium salt and an onium salt, respectively.

According to still another aspect of the present invention, there is provided a etching method in which a chemically amplified negative type resist pattern is used as a mask and a material layer below that is selectively etched. In practice, the chemically amplified negative type resist pattern comprises, a resin for forming the resist pattern, a first photo-acid generating agent having a molecular weight between 100 and 1000 and producing an acid having a diffusion length between 10 and 30 nm by exposure, a second photo-acid generating agent having a molecular weight between 100 and 1000 and producing an acid having a diffusion length between 30 and 60 nm by exposure. In particular, the second photo-acid generating agent is mixed into the first photo-acid generating agent at a ratio between 5 and 95 mol %. The first and the second photo-acid agents is mixed into a resin at a ratio that a total amount of the first and the second photo-acid generating agent is between 1 and 15 wt %. The first and the second photo-acid generating agents is specified by a single combination selected from a group consisting of a first combination of onium salts, a second combination of non-onium salts, and a third combination of a non-onium salt and an onium salt, respectively.

According to yet another aspect of the present invention, there is provided a semiconductor device manufacturing method for manufacturing a semiconductor device, in which a chemically amplified negative type resist pattern formed on a covering layer of a semiconductor substrate is used as a mask and said covering layer is selectively etched. In practice, the chemically amplified negative type resist pattern comprises a resin for forming the resist pattern, a first photo-acid generating agent having a molecular weight between 100 and 1000 and producing an acid having a diffusion length between 10 and 30 nm by exposure. A second photo-acid generating agent having a molecular weight between 100 and 1000 and producing an acid having a diffusion length between 30 and 60 nm by exposure. In particular, the second photo-acid generating agent is mixed into the first photo-acid generating agent at a ratio between 5 and 95 mol %. The first and the second photo-acid agents is mixed into a resin at a ratio that a total amount of the first and the second photo-acid generating agent is between 1 and 15 wt %. The first and the second photo-acid generating agents is specified by a single combination selected from a group consisting of a first combination of onium salts, a second combination of non-onium salts, and a third combination of a non-onium salt and an onium salt, respectively.

BRIEF DESCRIPTION OF THE DRAWINGS

FIGS. 1A, 1B and 1C are cross sectional views schematically illustrating a process for forming a resist pattern which is a dense pattern, to manufacture a semiconductor device according to a prior art;

FIGS. 2A, 2B and 2C are cross sectional views schematically illustrating a process for forming a resist pattern which is a sparse pattern, to manufacture a semiconductor device according to a prior art;

FIG. 3 is a cross sectional view schematically illustrating a process for forming a resist pattern, to manufacture a semiconductor device according to an embodiment of the present invention;

FIGS. 4A, 4B and 4C are cross sectional views schematically illustrating a process for forming a resist pattern which is a dense pattern using the resist pattern shown in FIG. 3; and FIGS. 5A, 5B and 5C are cross sectional views schematically illustrating a process for forming a resist pattern which is a sparse pattern using the resist pattern shown in FIG. 3.

DESCRIPTION OF THE PREFERRED EMBODIMENTS

Before describing a preferred embodiment of the present invention, a process for forming a resist pattern to manufacture a semiconductor device according to a prior art will be explained at first with reference to FIGS. 1 and 2, thereby permitting a better understanding of the present invention.

Referring to FIGS. 1A and 2A, it is understood that in general, if a resist film 15 formed on an etching treatment layer 13 of a silicon substrate 11 is a negative type resist, a concentration gradient of an acid 17 in a sparse pattern shown in FIG. 2A will be larger than that in a dense pattern shown in FIG. 1A. For this reason, an acid 17 is generated by an excimer laser 23 irradiating through a mask 21 so that a concentration of the acid becomes more dilute in a sparse pattern than in a dense pattern. Therefore, a sparse pattern will become narrower in size than that of a dense pattern.

Referring to FIGS. 1B and 2B, when an acid has a relatively long diffusion length, a cross linking reaction will be affected by a difference between an acid concentration in a sparse pattern shown in FIG. 2B and an acid concentration in a dense pattern shown in FIG. 1B. As a result, the sizes of patterns 25 will be different from each other due to different pattern densities.

For the reasons as discussed above, when a resist material is a negative type, it is preferred to use an acid having a relatively short diffusion length so as to reduce the size difference possibly caused due to different pattern densities. However, as shown in FIGS. 1C and 2C, when use is made of an acid generating agent capable of producing an acid having a relatively short diffusion length, irregularities will occur on side walls of patterns 27 due to an influence from a standing wave, thereby causing a considerable deterioration in the precision of pattern size.

Under the condition, it is difficult to inhibit the pattern size difference possibly caused due to different pattern densities and to at the same time form a resist shape with fewer irregularities. This means that ensuring two kinds of the effects at the same time is quite difficult, and such difficulty becomes more remarkable if resist patterns are formed in a further small configuration. As a result, it is indispensable to improve the quality of a resist material.

Now, a preferred embodiment of the present invention will be described in detail below with reference to FIGS. 3–5.

Referring to FIG. 3, a resist film 35 contains a photo-acid generating agent 31 capable of producing an acid having a relatively short diffusion length and another photo-acid generating agent 33 capable of producing an acid having a relatively long diffusion length. The resist film 35 is formed on an etching treatment layer 39 (to be selectively etched) laminated on a silicon substrate plate 37. Here, when a photo-acid generating agent has a molecular weight less than 100, its diffusion length will be too long. On the other hand, when a photo-acid generating agent has a molecular weight larger than 1000, its diffusion length will be too short. Therefore, each of the photo-acid generating agents 31 and 33 is required to have a molecular weight of 100–1000.

Further, one of the most important features of the present invention is to mix together two different kinds of photo-acid generating agents capable of producing different diffusion lengths. Here, when a photo-acid generating agent has a diffusion length shorter than 10 nm, a resist pattern will be deteriorated in its configuration. On the other hand, when a photo-acid generating agent has a diffusion length longer than 60 nm, a deterioration will be occurred in a resolution. Therefore, a diffusion length of 30 nm is just a middle value. In practice, the photo-acid generating agents 31 and 33 are capable of producing diffusion lengths of 10–30 nm and 30–60 nm, respectively.

In the present invention, as onium salt agents of photo-acid generating agent having a diffusion length of 10 to 30 nm, use can be made of Triphenyl sulfonium toluene sulfonate, Triphenyl sulfonium-4-methyl cyclohexyl sulfonate, Diphenyl iodium toluene sulfonate, and Triphenyl sulfonium-4-methyl cyclohexyl sulfonate, which are represented by the following general formulas (1-1), (1-2), (1-3), and (1-4), respectively.

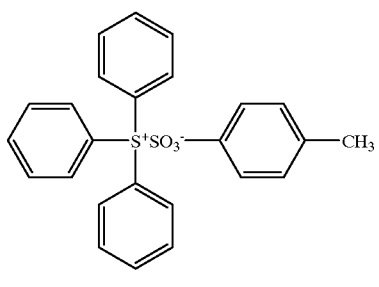

(Triphenyl sulfonium
toluenesulfonate)

(1-1)

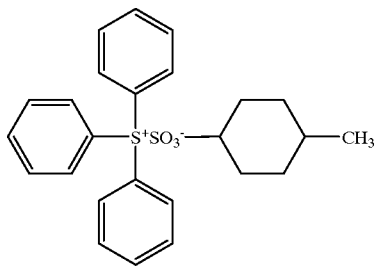

(Triphenyl sulfonium 4-methyl
cyclohexyl sulfonate)

(1-2)

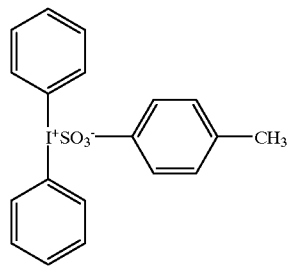

(Diphenyl iodonium
toluene sulfonate)

(1-3)

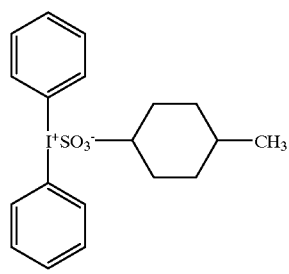

(Triphenyl sulfonium 4-methyl
cyclohexyl sulfonate)

(1-4)

In the present invention, as non-onium salt agents of photo-acid generating agent having a diffusion length of 10 to 30 nm, use can be made of N-toluene sulfonate-5-norbornen-2,3-dicarboxyimide, Phtalimide toluene sulfonate, Phthalimide-4-methyl cyclohexyl sulfonate, and Naphthalimide-4-methyl cyclohexyl sulfonate, which are represented by the following general formulas (2-1), (2-2), (2-3), (2-4) and (2-5), respectively.

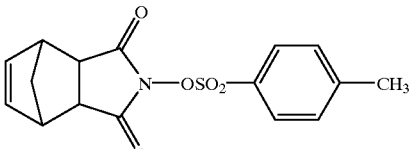

(N-toluene
sulfonate-5-norbornene-2,3-dicarboxyimide)

(2-1)

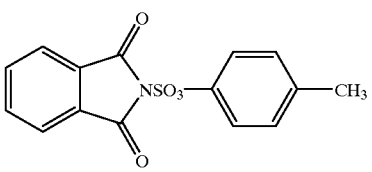

(Phthalimide toluene sulfonate)

(2-2)

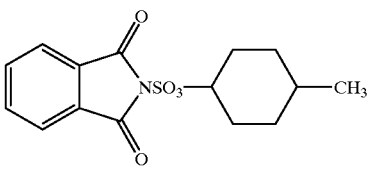

(Phthalimide 4-methyl
cyclohexyl sulfonate)

(2-3)

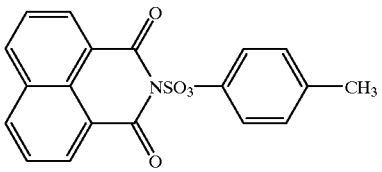

(Naphthalimide toluene
sulfonate)

(2-4)

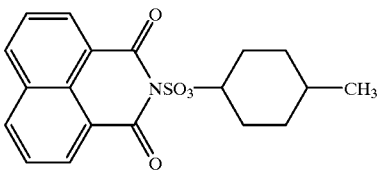

(Naphthalimide 4-methyl
cyclohexyl sulfonate)

(2-5)

In the present invention, as onium salt agents of photo-acid generating agent having a diffusion length of 30 to 60 nm, use can be made of Triphenyl sulfonium trifluoromethane sulfonate, Triphenyl sulfonium methane sulfonate, Diphenyl iodium trifluoromethane sulfonate, and Diphenyl iodonium methane sulfonate, which are represented by the following general formulas (3-1), (3-2), (3-3), and (3-4), respectively.

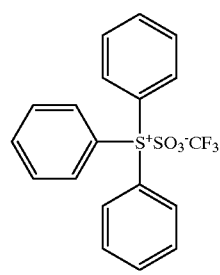

(Triphenyl sulfonium trifluoromethane sulfonate) (3-1)

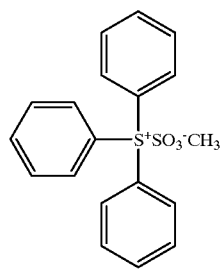

(Triphenyl sulfonium methane sulfonate) (3-2)

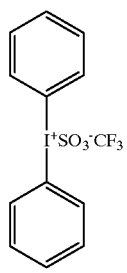

(Diphenyl iodonium trifluoromethane sulfonate) (3-3)

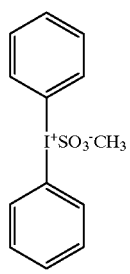

(Diphenyl iodonium methane sulfonate) (3-4)

In the present invention, as non-onium salt agents of photo-acid generating agent having a diffusion length of 30 to 60 nm, use can be made of N-trifluoromethane sulfonate-5-norbornen-2,3-dicarboxyimide, Phthalimide trifluoromethane sulfonate, Phthalimide trifluoromethane sulfonate, Naphthalimide trifluoromethane sulfonate, and Naphtalimide methane sulfonate, which are represented by the following general formulas (4-1), (4-2), (4-3), (4-4) and (4-5), respectively.

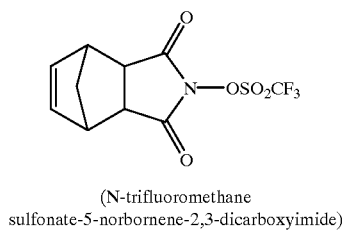

(N-trifluoromethane sulfonate-5-norbornene-2,3-dicarboxyimide) (4-1)

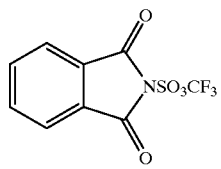

(Phthalimide trifluoromethane sulfonate) (4-2)

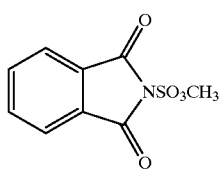

(Phthalimide methane sulfonate) (4-3)

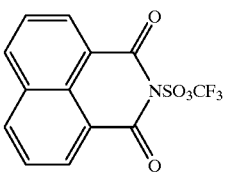

(Naphthalimide trifluoromethane sulfonate) (4-4)

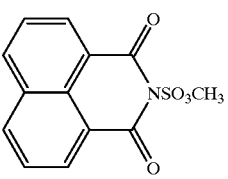

(Naphthalimide methane sulfonate) (4-5)

Further, when two kinds of photo-acid generating agents are mixed together, each kind of them should be added in an amount of 5 mol % or more, otherwise it will be difficult to obtain a predetermined effect. Here, each of the two kinds of photo-acid generating agents is added in an amount of 5–95 mol %.

Moreover, when several kinds of photo-acid generating agents are mixed with a resin, if a total amount of the several photo-acid generating agents is less than 1 weight percent, a resist will have a low sensitivity and it is not practically useful. On the other hand, if a total amount of the several photo-acid generating agents is larger than 15 weight percent, a resist will have a low heat tolerance. For this reason, it is necessary that a total amount of the several photo-acid generating agents is 1–15 weight percent.

FIGS. 4A–4C and FIGS. 5A–5C are explanatory views illustrating a process for forming a dens pattern and a sparse pattern, using a resist film 35 shown in FIG. 3. As shown in FIGS. 4A and 5A, the resist layer 35 is used to effect an exposure by allowing an excimer laser 41 to pass through a mask 43.

In this way, as shown in FIGS. 4B and 5B, a photo-acid generating agent 31 produces an acid 45 having a relatively long diffusion length, while a photo-acid generating agent 33 produces an acid 47 having a relatively long diffusion length.

Referring again to FIGS. 4C and 5C, since an acid having a diffusion length of 10–30 nm is an acid of short diffusion length, it helps to inhibit a pattern size difference possibly caused due to different pattern densities. On the other hand, since an acid having a diffusion length of 30–60 nm is an acid of long diffusion length, it helps to inhibit the formation of irregularities on the side walls of a pattern, which irregularities will otherwise be caused due to an influence from a standing wave. In this way, by virtue of an interaction among several acids having different diffusion lengths, it is allowed to form a resist pattern 49 capable of inhibiting a pattern size difference which will otherwise be caused due to different pattern densities.

In this manner, a resist pattern 49 may be used as a mask and a covering layer 39 is selectively etched, thereby forming a desired semiconductor integrated circuit pattern from the covering layer 39, thus allowing production of a semiconductor device.

Flowing examples 1–3 are used to explain some actual examples of resist materials used in the present invention.

EXAMPLE 1

In example 1 of the present invention, a chemically amplified negative type resist contains, as photo-acid generating agents having the above general formulas (1-1) and (3-1), a triphenyl sulfonium toluenesulfonate (the toluenesulfonic acid has a diffusion length of 23 nm) and a triphenyl sulfonium trifluoro methanesulfonate (the trifluoro methanesulfonic acid has a diffusion length of 46 nm).

Further, this chemically amplified negative type resist contains a polyhydroxy styrene resin, a melamine derivative serving as a cross linking agent, a triphenyl sulfonium toluenesulfonate and a triphenyl sulfonium trifluoro methanesulfonate, the last two of which are mixed together each having a mixing ratio of 50 mol % and form a weight percent of 7.0% when mixing with a resin.

The chemically amplified negative type resist was thus used to form a resist layer on a wafer. After that, the resist film is exposed with the use of a KrF excimer laser passing through a mask or a reticle having a desired semiconductor integrated circuit pattern, followed by a PEB treatment and a developing treatment. As a result, it was able to obtain a resist pattern having fewer irregularities on the side walls thereof, with a pattern size ratio of a sparse pattern to a dens pattern being only 0.95.

EXAMPLE 2

In example 2 of the present invention, a chemically amplified negative type resist contains, as photo-acid generating agents having the above general formulas (2-1) and (3-1), an N-toluene sulfonate-5-norbornene-2,3-dicarboxyimide (the toluenesulfonic acid has a diffusion length of 23 nm) and a triphenyl sulfonium trifluoro methanesulfonate (the trifluoro methanesulfonic acid has a diffusion length of 46 nm).

Further, this chemically amplified negative type resist contains, a polyhydroxy styrene resin, a melamine derivative serving as a cross linking agent, an N-toluensulfonate-5-norbornene-2,3-dicarboxyimide and a triphenyl sulfonium trifluoro methanesulfonate, the last two of which are mixed together each having a mixing ratio of 40 mol % and form a weight percent of 6.0% when mixing with a resin.

The chemically amplified negative type resist was thus used to form a resist layer on a wafer. After that, the resist film is exposed with the use of a KrF excimer laser passing through a mask or a reticle having a desired semiconductor integrated circuit pattern, followed by a PEB treatment and a developing treatment. As a result, it was able to obtain a resist pattern having fewer irregularities on the side walls thereof, with a pattern size ratio of a sparse pattern to a dens pattern being only 0.90.

EXAMPLE 3

In example 3 of the present invention, a chemically amplified negative resist contains, as photo acid generating agents having the above general formulas (3-1) and (4-1), an N-toluene sulfonate-5-norbornene-2,3-dicarboxyimide(the toluenesulfonic acid has a diffusion length of 23 nm) and an N-trifluoromethane sulfonatte-5-norbornene-2,3-dicarboxyimide (the trifluoro methanesulfonic acid has a diffusion length of 46 nm).

Further, this chemically amplified negative resist contains, a polyhydroxy styrene resin, a melamine derivative serving as a cross linking agent, an N-toluene suulfonate-5-norbornene-2,3-dicarboxyimide and an N-trifluoromethane-5-norbornene-2,3-dicarboxyimide, the last two of which are mixed together each having a mixing ratio of 30 mol % and form a weight percent of 5.0% when mixing with a resin.

The chemically amplified negative type resist was thus used to form a resist layer on a wafer. After that, the resist film is exposed with the use of a KrF excimer laser passing through a mask or a reticle having a desired semiconductor integrated circuit pattern, followed by a PEB treatment and a developing treatment. As a result, it was able to obtain a resist pattern having fewer irregularities on the side walls thereof, with a pattern size ratio of a sparse pattern to a dens pattern being only 0.91.

As explained in the description, with the use of a chemically amplified negative type resist made according to the present invention, it is allowed to inhibit a size difference possibly caused due to different pattern densities, and at the same time it is possible to form a desired resist having fewer irregularities on the side walls thereof. Further, if several acid generating acids are properly mixed together to ensure a most appropriate shape for each resist, it is possible to improve a focus depth and size precision by about 10% or more.

In particular, the effects will be more remarkable with respect to a micro-type pattern, thereby making it possible to reproducibly form a photoresist pattern having a size corresponding to the size of a mask.

What is claimed is:

1. A resist material, comprising:

a resin for forming the resist material;

a first photo-acid generating agent having a molecular weight between 100 and 1000 and producing a photo-acid having a diffusion length between 10 and 30 nm by exposure; and a second photo-acid generating agent having a molecular weight between 100 to 1000 and producing an photo-acid having a diffusion length between 30 and 60 nm by exposure, the second photo-acid generating agent being mixed into the first photo-acid generating agent at a ratio between 5 and 95 mol %, the first and the second photo-acid agents being mixed into a resin at a ratio that a total amount of the first and the second photo-acid generating agent is between 1 and 15 wt %, the first and the second photo-acid generating agents being specified by a single combination selected from a group consisting of a first combination of onium salts, a second combination of non-onium salts, and a third combination of a non-onium salt and an onium salt, respectively.

2. The resist material according to claim 1, wherein at least one of the first and second photo-acid generating agents is a sulfonate.

3. The resist material according to claim 1, wherein said onium salt photo-acid generating agent is sulfonium or iodonium, said non-onium salt photp-acid generating agent is ester of imide.

4. The resist material according to claim 1, wherein said onium salt photo-acid generating agent is at least one selected from the group consisting of Triphenyl sulfonium toluene sulfonate, Triphenyl sulfonium-4-methyl cyclohexyl sulfonate, Diphenyl iodonium toluene sulfonate, and Triphenyl iodonium-4-methyl cyclohexyl sulfonate in said first photo-acid generating agent, said non-onium salt photo-acid generating agent being at least one selected from the group consisting of N-toluene sulfonate-5-norbornene-2,3-dicarboxyimide, Phthalimide toluene sulfonate, Phthalimide-4-methyl cyclohexyl sulfonate, Naphthalimide toluene sulfonate, and Naphthalimide-4-methyl cyclohexyl sulfonate in said first photo-acid generating agent, said onium salt photo-acid generating agent is at least one selected from the group consisting of Triphenyl sulfonium trifluoromethane sulfonate, Triphenyl sulfonium-methane sulfonate, Diphenyl iodonium trifluoromethane sulfonate, and Diphenyl iodonium methane sulfonate in said second photo-acid generating agent, said non-onium salt photo-acid generating agent being at least one selected from the group consisting of N-trifluoromethane sulfonate-5-norbornene-2,3-dicarboxyimide, Phthalimide trifluoromethane sulfonate, Phthalimide methane sulfonate, Naphthalimide trifluoromethane sulfonate, and Naphthalimide methane sulfonate in said second photo-acid generating agent.

5. A chemically amplified negative resist pattern, comprising:

a resin for forming the resist pattern;

a first photo-acid generating agent having a molecular weight between 100 and 1000 and producing an acid having a diffusion length between 10 and 30 nm by exposure; and a second photo-acid generating agent having a molecular weight between 100 and 1000 and producing an acid having a diffusion length between 30 and 60 nm by exposure, the second photo-acid generating agent being mixed into the first photo-acid generating agent at a ratio between 5 and 95 mol %, the first and the second photo-acid agents being mixed into a resin at a ratio that a total amount of the first and the second photo-acid generating agents is between 1 and 15 wt %, the first and the second photo-acid generating agents being specified by a single combination selected from a group consisting of a first combination of onium salts, a second combination of non-onium salts, and a third combination of a non-onium salt and an onium salt, respectively.

6. The chemically amplified negative resist pattern according to claim 5, wherein at least one of the first and second photo-acid generating agents is a sulfonate.

7. The chemically amplified negative resist pattern according to claim 5, wherein said onium salt photo-acid generating agent is sulfonium or iodonium, said non-onium salt photp-acid generating agent is ester of imide.

8. The chemically amplified negative resist pattern according to claim 5, wherein said onium salt photo-acid generating agent is at least one selected from the group consisting of Triphenyl sulfonium toluene sulfonate, Triphenyl sulfonium-4-methyl cyclohexyl sulfonate, Diphenyl iodonium toluene sulfonate, and Triphenyl iodonium-4-methyl cyclohexyl sulfonate in said first photo-acid generating agent, said non-onium salt photo-acid generating agent being at least one selected from the group consisting of N-toluene sulfonate-5-norbornene-2,3-dicarboxyimide, Phthalimide toluene sulfonate, Phthalimide-4-methyl cyclohexyl sulfonate, Naphthalimide toluene sulfonate, and Naphthalimide-4-methyl cyclohexyl sulfonate in said first photo-acid generating agent, said onium salt photo-acid generating agent is at least one selected from the group consisting of Triphenyl sulfonium trifluoromethane sulfonate, Triphenyl sulfonium-methane sulfonate, Diphenyl iodonium trifluoromethane sulfonate, and Diphenyl iodonium methane sulfonate in said second photo-acid generating agent, said non-onium salt photo-acid generating agent being at least one selected from the group consisting of N-trifluoromethane sulfonate-5-norbornene-2,3-dicarboxyimide, Phthalimide trifluoromethane sulfonate, Phthalimide methane sulfonate, Naphthalimide trifluoromethane sulfonate, and Naphthalimide methane sulfonate in said second photo-acid generating agent.

\* \* \* \* \*